(12) United States Patent
Sivadas et al.

(10) Patent No.: US 9,450,546 B2
(45) Date of Patent: Sep. 20, 2016

(54) SYSTEM, METHOD AND DEVICE FOR POWER AMPLIFICATION OF A SIGNAL IN AN INTEGRATED CIRCUIT

(71) Applicant: Texas Instruments Incorporated, Dallas, TX (US)

(72) Inventors: Apu Sivadas, Bangalore (IN); Alok Joshi, Bangalore (IN); Krishnaswamy Thiagarajan, Bangalore (IN); Rakesh Kumar, Ghazipur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 105 days.

(21) Appl. No.: 14/165,251

(22) Filed: Jan. 27, 2014

(65) Prior Publication Data
US 2015/0214907 A1   Jul. 30, 2015

(51) Int. Cl.
| | |
|---|---|
| *H03F 3/21* | (2006.01) |
| *H03F 3/213* | (2006.01) |
| *H03F 3/24* | (2006.01) |
| *H03F 3/195* | (2006.01) |
| *H03F 3/72* | (2006.01) |

(52) U.S. Cl.
CPC .............. *H03F 3/211* (2013.01); *H03F 3/195* (2013.01); *H03F 3/245* (2013.01); *H03F 3/72* (2013.01); *H03F 2200/537* (2013.01); *H03F 2200/541* (2013.01); *H03F 2203/21145* (2013.01); *H03F 2203/7221* (2013.01); *H03F 2203/7236* (2013.01)

(58) Field of Classification Search
USPC .......................................... 330/252–261, 301
See application file for complete search history.

(56) References Cited

U.S. PATENT DOCUMENTS

| | | | |
|---|---|---|---|
| 6,294,955 B1 | 9/2001 | Luu et al. | |
| 8,912,865 B2 * | 12/2014 | Kim et al. | ..................... 333/131 |

FOREIGN PATENT DOCUMENTS

| | | |
|---|---|---|
| GB | 1189010 | 4/1970 |
| RU | 2117381 C1 | 8/1998 |

* cited by examiner

*Primary Examiner* — Hieu Nguyen
(74) *Attorney, Agent, or Firm* — Ronald O. Neerings; Frank D. Cimino

(57) ABSTRACT

According to an aspect of present disclosure, a set of power amplifiers are used to amplify power of a signal for transmission. The signal powers from a set of power amplifiers are coupled to set of primary windings which are commonly coupled to a secondary winding such that the powers on the primary windings are additive in the secondary winding. A current path on the primary side is provided for flow of a current that is induced on at least one primary winding when a power amplifier coupled to that primary winding is in "off" state. As a result, the induced current is prevented from flowing in to the power amplifier that are in "on" state. Further, the current path isolates the power amplifiers from each other thereby enabling the power amplifiers to operate at the rated efficiency. In one embodiment, the current path is provided using a resistor network.

20 Claims, 3 Drawing Sheets

US 9,450,546 B2

SYSTEM, METHOD AND DEVICE FOR POWER AMPLIFICATION OF A SIGNAL IN AN INTEGRATED CIRCUIT

TECHNICAL FIELD

The present disclosure relates generally to amplifying electric and electronic signal and more specifically to a system, method and device for power amplification of a signal.

RELATED ART

Power of a signal is often amplified to meet certain requirements in an integrated circuit. For example, in a wireless communication system, an integrated circuit is implemented to amplify power of a radio frequency (RF) signal to increase the transmission range. In general, large size transistors/devices such as complementary metal oxide semiconductor (CMOS) are fabricated to support larger power gain. In one prior technique, multiple power amplifiers of smaller gain are implemented thereby reducing the size of the transistors. The outputs of the multiple power amplifiers are then combined to achieve the desired power level of the signal.

SUMMARY

According to an aspect of present disclosure, a set of power amplifiers are used to amplify power of a signal for transmission. The signal powers from a set of power amplifiers are coupled to set of primary windings which are commonly coupled to a secondary winding such that the powers on the primary windings are additive in the secondary winding. A current path on the primary windings side is provided for flow of a current that is induced on at least one primary winding by a current flowing in the secondary winding when a power amplifier coupled to that primary winding is in "off" state. As a result, the induced current is prevented from flowing into the power amplifiers that are in "on" state. Further, the current path isolates the power amplifiers from each other thereby enabling the power amplifiers to operate at the rated efficiency. In one embodiment, the current path is provided using a resistor network.

Several aspects are described below, with reference to diagrams. It should be understood that numerous specific details, relationships, and methods are set forth to provide a full understanding of the present disclosure. One skilled in the relevant art, however, will readily recognize that the present disclosure can be practiced without one or more of the specific details, or with other methods, etc. In other instances, well-known structures or operations are not shown in detail to avoid obscuring the features of the present disclosure.

DETAILED DESCRIPTION

Figure 1:
FIG. 1 is an example environment in which various aspect of the present disclosure are seen.

FIG. 1 is an example environment in which various aspect of the present disclosure are seen. As shown, the FIG. 1 comprises a transmitting device 110, communication network 120, and receiving device 130. Each block is described in further detail below.

The transmitting device 110 is an electronic device/ integrated circuit (IC) configured to transmit signals (for example radio frequency signal). The transmitting device 110 comprises frequency multiplier, data encoder, power amplifiers, filters, matching networks and transmit antenna, for example. Various parameters such as the frequency of operation, type of modulation, gain of the power amplifiers and impedance matching etc., are adjusted in the transmitting device 110 meeting/complying to a desired transmission standard.

The communication network 120 enables communication between transmitting device 110 and receiving device 130. The communication network may comprise a radio frequency channel such as VHF, UHF, GSM, CDMA etc., and physical channel such as cable, optical cable etc.

The receiving device 130 is an electronic device/IC configured to receive a signal from the communication network 120. The receiver device 130 may be configured to operate in conjunction with the transmitter device 110 to receive and extract the signal transmitted by the transmitter device 110. Accordingly, the receiver device 130 may comprise an antenna, tuner, mixer, decoder, radio frequency (RF) receiver, detector, one or more tuned radio frequency amplifiers, etc. The receiving device 130 may employ electronic filters to separate the desired signal (occupying a frequency range) from other signals received by the antenna from the communication network 120. The receiving device 130 may employ power amplifier to increase the power of the received signal for further processing. The manner in which the power amplifiers and other signal processing elements are implemented in conventional devices is described below.

Figure 2:
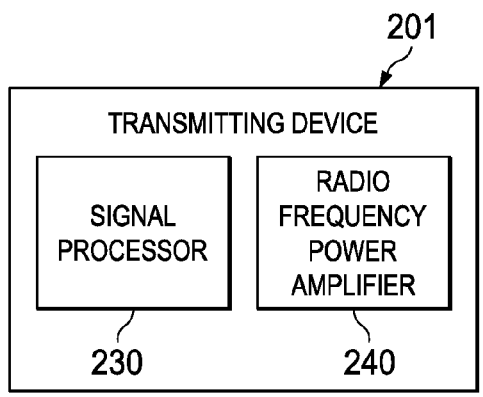
FIG. 2 is a block diagram of an example conventional transmitter device.

FIG. 2 is a block diagram of an example conventional transmitter device. As shown, the transmitter/transmitting device 201 comprises signal processors 230 and a power amplifier 240.

The signal processor 230 is an IC implemented with a small size devices (transistors, diodes, capacitors etc.,) using corresponding fabrication technology. Signal processer 230 is configured to process the signal at a low power (signal level) and may comprise compressor, expanders, limiters, encoder, modulator up-convertor etc. The processed signal is provided to power amplifier 240.

The power amplifier 240 is an IC configured to amplify the power of the signal received from the signal processor 230. The power amplifier 240 is constructed with devices (for example, transistors) of large size capable of handling large power/current. For example the transistors in the power amplifier 240 may be implemented with larger channel width compared to the transistors in the signal processor 230. Thus, the conventional transmitter 201 is implemented with two ICs fabricated using different fabrication techniques. Accordingly, conventional transmitters are not cost effective due to use of multiple ICs/fabrication techniques. Further the gain of the power amplifier may not be substantially varied in the conventional power amplifiers.

The manner in which a power amplifier may be implemented using small size devices overcoming at least some of the disadvantages in the conventional transmitter is described below.

Figure 3:
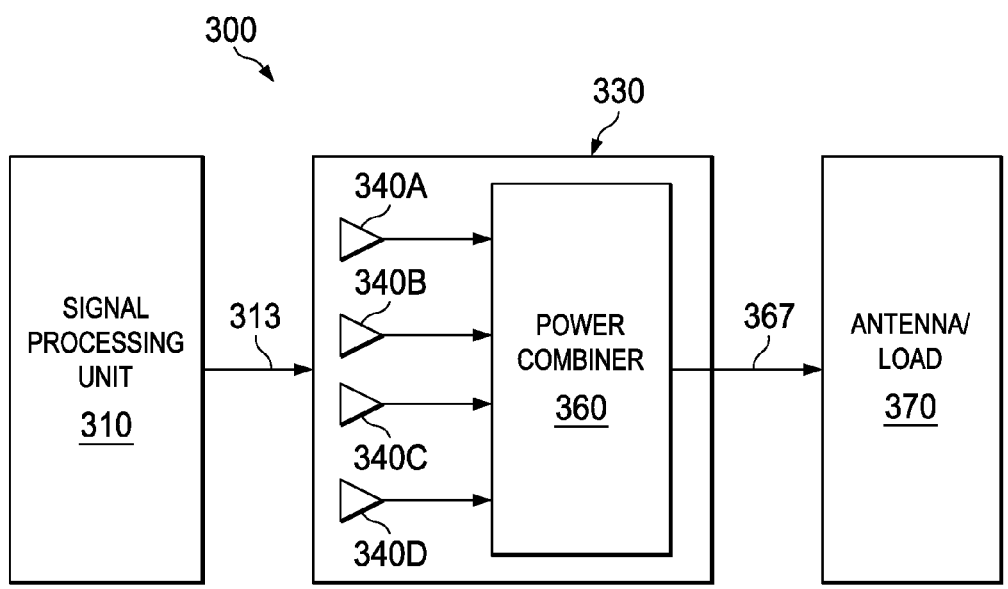
FIG. 3 is block diagram of an example integrated circuit illustrating the implementation of power amplifier in an embodiment of the present disclosure.

FIG. 3 is block diagram of an example integrated circuit illustrating the implementation of power amplifier in an embodiment of the present disclosure. As shown, the integrated circuit 300 comprises signal processor 310, power amplifier unit 330 and an antenna 370. Each block is described below in further detail.

The signal processor 310 is configured to process the signal at a low power (signal level) and may comprise compressor, expanders, limiters, encoder, modulator up-convertor etc. The processed signal is provided to power amplifier unit 330 on path 313. The antenna 370 converts electric power into electromagnetic radiation. In one embodiment, the antenna 370 is implemented as part of the integrated circuit 300. Alternatively, the antenna 370 may represent a load connected to the power combiner 360.

The power amplifier unit 330 amplifies the power of the signal on path 313 by a desired gain factor (gain). The amplified signal is provided to the antenna 370. As shown in the FIG. 3, the power amplifier unit 330 is shown comprising the power amplifiers 340A through 340D and power combiner 360. Each power amplifier 340A through 340D is configured to amplify the power by a fraction of the total desired amplification (gain). Thus, each power amplifier 340A through 340D is configured to handle a fraction of the overall output power or current on the path 367. In one embodiment, power amplifiers 340A through 340D are implemented as complementary metal-oxide-semiconductor (CMOS). Since each power amplifier 340A through 340D handles only a fraction of the total power required, the amplifiers 340A through 340D are implemented using the small size devices. Accordingly, the signal processing unit 310 and the amplifier unit 330 are implemented on a single substrate using same fabrication technology in one IC.

The power combiner 360 combines output power of the power amplifiers 340A through 340D thereby delivering a signal with a desired power to the antenna 370. The manner in which the combiner may be implemented on the integrated circuit 300 is further described below.

Figure 4:
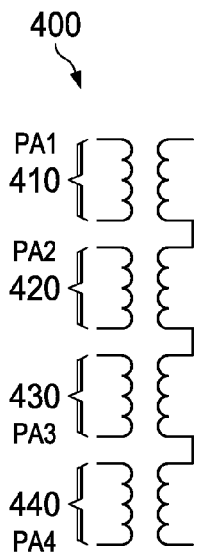
FIG. 4 is a schematic diagram of an example power combiner in one embodiment of the present disclosure.

FIG. 4 is a schematic diagram of an example power combiner in one embodiment of the present disclosure. As shown, combiner 400 comprises primary windings 410, 420, 430 and 440, and the secondary windings 490. The primary windings 410, 420, 430 and 440 and secondary windings 490 are inductively/electromagnetically coupled (for example, as in case of transformers) to transfer energy (current) in the primary windings 410, 420, 430 and 440 to the secondary winding 490. The windings are arranged such that the energy (current) transferred from each primary winding 410, 420, 430 and 440 is additive in the secondary 490. In one embodiment, the output of the each power amplifier 340A through 340D is respectively coupled to the primary windings 410 through 440. Thus, the current (power) on each primary winding is proportional to the output power of corresponding power amplifier 340A through 340D. Accordingly, the power on the secondary winding 490 is sum of the power (or cumulative addition) of the power transferred to secondary winding 490 from each primary winding 410 through 440. Thus attaining the required power without using the larger size transistors in the power amplifiers 340A through 340D.

Figure 5:
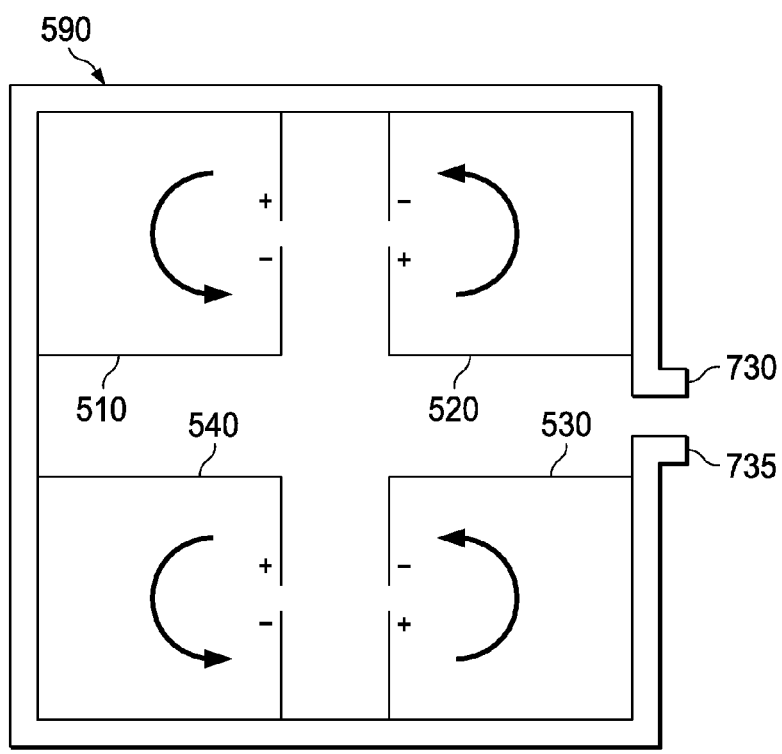
FIG. 5 is a layout portion of an integrated circuit depicting an example combiner.

FIG. 5 is a layout portion of an integrated circuit depicting an example combiner. As shown there, the square track 510, 520, 530 and 540 are conductive tracks etched on one of the metal layer (for example on a metal layer 6). The square track 510, 520, 530 and 540 represent the primary windings 410, 420, 430 and 440. Each square track 510, 520, 530 and 540 has openings (marked "+" and "−") configured to receive power amplifier outputs. The square track 590 is a conductive track etched on the periphery formed by the square track 510, 520, 530 and 540. The square track 590 represents the secondary winding 490. The square track 590 may be etched on the redistribution layer (RDL) of the ICT. The square track 590 may operate as RF antenna and radiate the signal, in one embodiment. The primary and the secondary square tracks are inductively/magnetically coupled to each other and transfer energy when the current flows in the primary square track 510, 520, 530 and 540. For example, each primary winding induces the current in the secondary winding 590 that is equal to the current injected by the respective power amplifier. The length of the primary square track 510 through 540 and secondary square track 590 may be adjusted to match impedance level of the power amplifiers 340A through 340D. The secondary winding 590 may act as an antenna and may be matched to 50 Ohms impedance, in an embodiment.

In one embodiment, the total energy transferred to the secondary winding 490 may be controlled by turning off (or turning on) the desired number of power amplifiers. For example, if the power amplifier unit 330 is configured to provide a power P when all the power amplifiers are turned on, the power delivered to the antenna (or as output power of the unit 330) may be reduced 0.5*P by turning off (or disconnecting the power amplifier from the primary windings) half the number of power amplifiers in the power amplifier unit 330 (in the particular example, two power amplifiers may be turned off).

However, turning some of the power amplifiers to "off" state may load the power amplifiers that are in "on" state. Such loading of the power amplifier in "on" state may affect the intended power delivered to the primary by the respective "on" state power amplifiers. Alternately, the "on" state power amplifier may operate at much lower efficiency thus, delivering a power much less than the peak power achievable otherwise. For example, if each power amplifier is configured to deliver ¼ of the total power (P), then when one of the power amplifiers is turned off, each amplifier may deliver power less than the intended ¼ P due to the loading. Further, the power delivered by each power amplifier that is in "on" state may induce a undesired high EMF (electromagnetic field) on the primary windings of the power amplifiers that are turned off thereby not isolating the power amplifier from each other. Accordingly, in one embodiment the combiner is configured to provide isolation to the power amplifiers at the primary from each other and thereby deliver substantially the intended power to the corresponding primary when some of the power amplifiers are turned off or disconnected.

Figure 6:
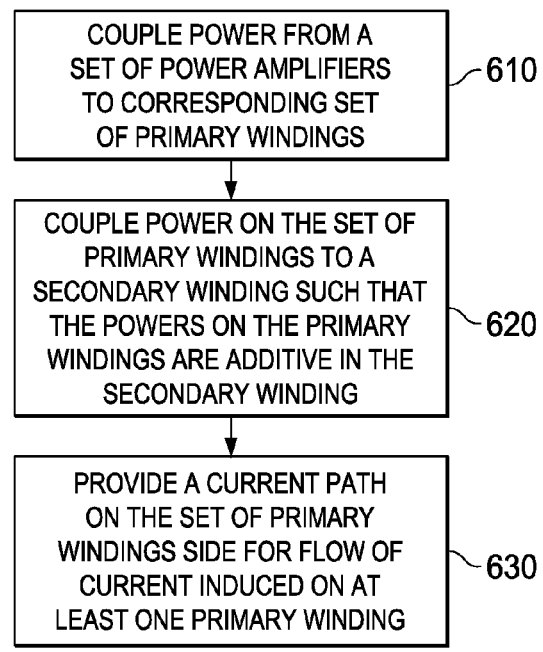
FIG. 6 is a block diagram illustrating manner in which the power amplifiers are isolated from each other, in one embodiment.

FIG. 6 is a block diagram illustrating manner in which the power amplifiers are isolated from each other, in one embodiment. In block 610, the power combiner 360 couples power from a set of power amplifiers to corresponding set of primary windings. The power combiner 360 may receive power in the form of amplified output current or voltage from power amplifiers 340A through 340D.

In block 620, the power combiner 360 couples power on the set of primary windings to a secondary winding such that the powers on the primary windings are additive in the secondary winding. The combiner 360 may employ suitable winding ratio. In one embodiment, the ratio is maintained at 1:1 such that substantially a same power on each primary winding is transferred to secondary. For example the current flowing through each of the primary winding 410 through 440 induces a same current in the secondary winding 490. The induced current adds up in the secondary winding 490 and produces desired high output power at the output terminal of the secondary winding 490.

In block 630, the power combiner 360 provides a current path on the set of primary windings side for flow of current induced on the at least one primary winding by the current flowing in the secondary winding (for example, 410 through 440). For example, the current is induced in the primary when the corresponding power amplifier is in "off" state. In one embodiment, the (counter) current path reduces flow of induced counter current into the power amplifier connected to the primary windings. Alternatively, substantially a zero current is made to flow into the power amplifier that is turned off. Similarly, no (counter) current is flown into the power amplifiers that are in "on" state. As a result, the power amplifiers are isolated from each other. The manner in which an alternative current path may be provided is described in further detail below.

Figure 7:
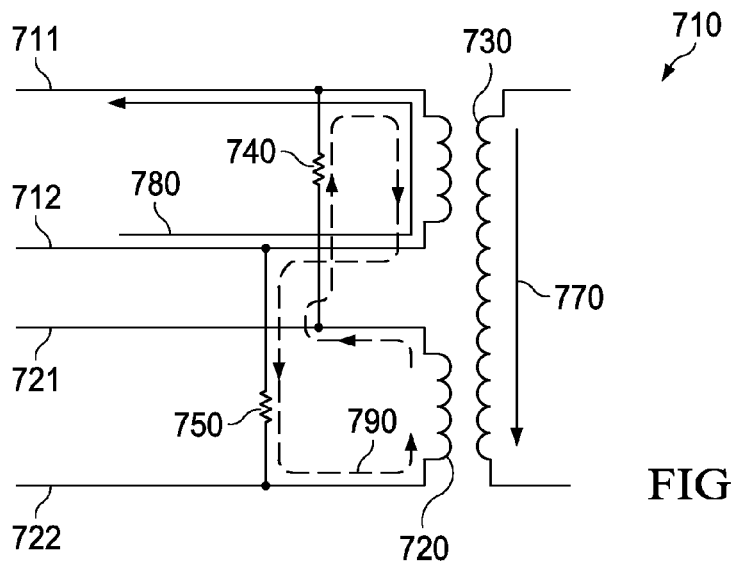
FIG. 7 is an example circuit diagram illustrating the manner in which the counter current path may be introduced on the primary winding side providing isolation to the power amplifiers, in one embodiment.

FIG. 7 is an example circuit diagram illustrating the manner in which the (counter) current path may be introduced on the primary winding side providing isolation to the power amplifiers, in one embodiment. The circuit diagram is shown comprising two primary windings 710 and 720, and a secondary winding 730. The isolation resistor 740 is connected between the terminals 711 and 721 of the primary windings 710 and 720 respectively. Similarly, isolation resistor 750 is connected in between the terminals 712 and 722 of the primary windings 710 and 720 respectively. In one embodiment, the terminals 712 and 722 (positive terminals) are configured to receive the current from the two power amplifiers. The terminals 711 and 712 (negative terminals) are configured to provide current return path to the respective power amplifier.

In one embodiment, the power amplifier connected to the primary winding 720 is turned off. Accordingly, as shown in FIG. 7, current 780 received on terminal 712 flows through the primary winding 710. The current flowing through the primary winding 710 induces a current 770 in the secondary winding 730. The current 770 in the secondary winding 730 induces a voltage or EMF (electromagnetic field) across the primary winding 720.

In one embodiment, as shown in the FIG. 7, the resistors 740 and 750 provide a path enabling the current 790 to flow through the resistor 740 and 750. Thus not affecting the current on the paths 711, 712, 721, and 712 connected to the power amplifiers. Thereby providing the isolation to the power amplifiers.

In the absence of the resistor 740 and 750, the power amplifier connected to the primary winding 710 may experience enhanced loading resulting in the possible operation of the power amplifier at a reduced efficiency.

The manner in which the alternative counter current path may be provided using a resistor network when the numbers of primary windings are more than two is further described below.

Figure 8A:
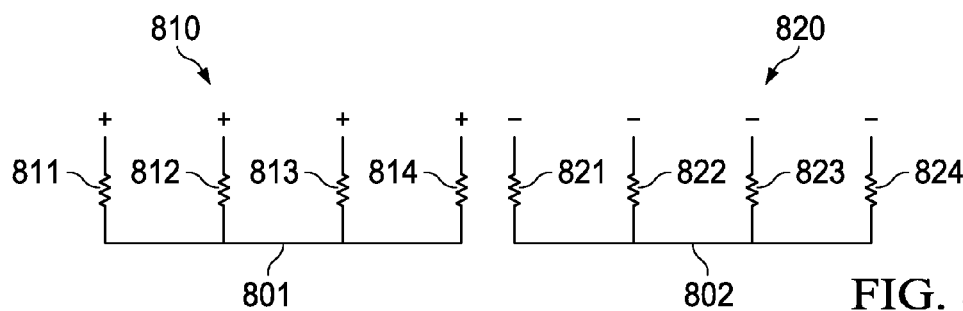
FIG. 8A is an example resistor network that may be connected to the combiner 400 for providing the counter current path in the primary windings, in one embodiment.

FIG. 8A is an example resistor network that may be connected to the combiner 400 for providing the counter current path in the primary windings, in one embodiment. The FIG. 8A is shown comprising the resistor network 810 comprising resistors 811 through 814 and resistor network 820 comprising 821 through 824. In the resistor network 810, one end of each resistor 811 through 814 is connected to the common terminal 801 and in the resistor network 820, one end of each resistor 821 through 824 is connected to the common terminal 802. The other end of the resistors 811 through 814 (marked +) are connected to the positive terminals of the corresponding ones of the primary winding. Similarly, the other end of the resistors 821 through 824 (marked −) are connected to the negative terminals of the corresponding ones of the primary windings. An example connections of the resistor networks 801 and 802 are further illustrated in FIG. 8B.

Figure 8B:
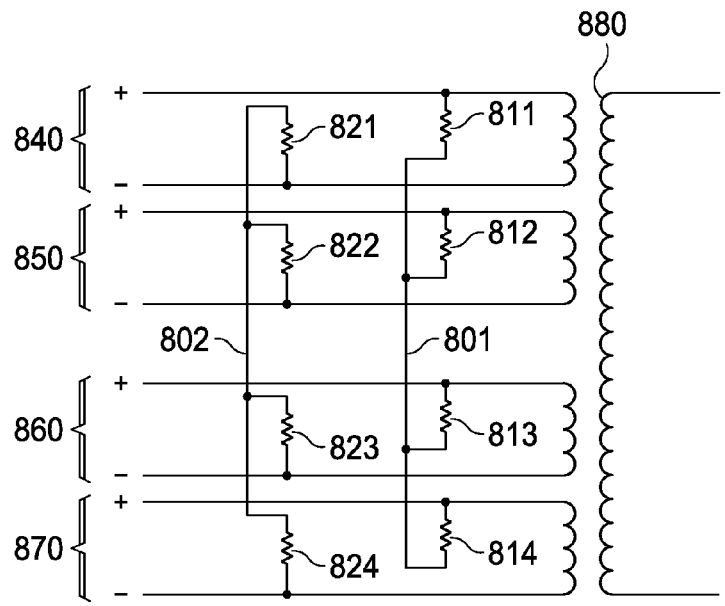
FIG. 8B is an example combiner in one embodiment.

FIG. 8B is an example combiner in one embodiment. As shown there, the combiner comprises primary windings 840, 850, 860 and 870 coupled to the secondary winding 780. Each primary winding 840, 850, 860 and 870 are configured to connect to the corresponding ones of the power amplifiers (for example, 340A through 340D) outputs. Thus, combining the power at the secondary 880.

Resistor network 801, comprising resistors 811 through 814, is connected to the + terminal of each primary winding. Similarly, resistor network 802, comprising resistors 821 through 824, is connected to the − terminal of each primary winding. As a result, an alternative path is provided for the flow of current (induced from the secondary) on the primary. Thereby, substantially, no current, induced on the primary winding from the secondary winding, is flown into the power amplifier connected to the corresponding primary winding.

While various examples of the present disclosure have been described above, it should be understood that they have been presented by way of example, and not limitation. Thus, the breadth and scope of the present disclosure should not be limited by any of the above-described examples, but should be defined in accordance with the following claims and their equivalents.

What is claimed is:

1. An integrated circuit comprising:
   a first power amplifier and a second power amplifier;
   a first primary winding configured to directly receive first power solely from the first power amplifier and a second primary winding configured to directly receive second power solely from the second power amplifier wherein, both the first primary winding and the second primary winding are commonly electromagnetically coupled to a secondary winding such that the power transferred from the first primary winding and the second primary winding are additive on the secondary winding; and
   a current path connected between the first primary winding and the second primary winding enabling a flow of a first current induced on at least one of first primary winding and second primary winding when one of first power amplifier and second power amplifier is in "off" state.

2. The integrated circuit of claim 1, wherein the first current is induced by a current flowing in the secondary winding and the current path is outside of the first and second power amplifier.

3. The integrated circuit of claim 2, wherein the current path comprises a first resistor and a second resistor, wherein the first resistor is coupled between positive terminals of the first and second primary windings, and the second resistor is coupled between negative terminals of the first and second primary windings.

4. The integrated circuit of claim 2, wherein the first power amplifier and the second power amplifier are configured to amplify a signal for transmission over a communication channel.

5. The integrated circuit of claim 4, wherein the secondary winding is configured to transmit the signal at a transmit power substantially equal to the sum of the first power and the second power coupled by the first and second primary windings.

6. The integrated circuit of claim 5, wherein the transmit power is reduced by turning the first power amplifier to "off" state thereby making the first power equal to zero.

7. The integrated circuit of claim 2, wherein the first primary winding and the second primary winding are etched on a metal layer and the secondary winding is formed on a redistribution layer of the integrated circuit.

8. The integrated circuit of claim 7, wherein the first primary winding and the second primary winding are inductively coupled to the secondary winding.

9. The integrated circuit of claim 7, further comprising a signal processing unit wherein the components of the first power amplifier, the second power amplifier and the signal processing unit are fabricated employing a same fabrication technique.

10. A method comprising:
coupling power from a set of power amplifiers to a corresponding set of primary windings, each primary winding coupled to receive power directly only from a corresponding one of the power amplifiers;
electromagnetically coupling power on the set of primary windings to a secondary winding such that the powers on the primary windings are additive in the secondary winding; and
providing a current path between the set of primary windings for flow of a first current induced on at least one primary winding when a power amplifier coupled to the primary winding is in "off" state.

11. The method of claim 10, wherein the induced current is induced on a primary winding by a current flowing in the secondary winding when a power amplifier connected to the primary winding is in off state.

12. The method of claim 11, wherein the current path comprises a first resistive network and a second resistive network, wherein the first resistive network is connected between a first common terminal and set of positive terminals of the set of primary windings and the second resistive network is connected between a second common terminal and a set of negative terminals on the set of primary windings.

13. The method of claim 10, wherein the set of power amplifiers are configured to amplify a signal for transmission over a communication channel.

14. The method of claim 13, wherein the secondary winding is configured to transmit the signal at a transmit power substantially equal to the sum of the power received from the set of primary windings.

15. The method of claim 14 further comprising varying the transmit power by varying a ratio of "on" state and "off" state power amplifiers in the first set of power amplifier, wherein the "off" state power amplifier couples a zero power to the corresponding primary windings.

16. The method of claim 15, wherein each power amplifier is configured to amplify the signal power to a fraction of a maximum transmit power.

17. The method of claim 16, wherein the set of primary windings are etched on a metal layer and the secondary winding is formed on a redistribution layer of the integrated circuit.

18. A transmitter comprising:
a set of power amplifiers configured to amplify a signal for transmission over a communication channel, wherein each power amplifier in the set of power amplifiers amplifies the power of the signal to a fraction of a transmit power when operated in an "on" state and zero power otherwise;
a set of primary windings with each primary winding comprising a positive and a negative terminal coupled to a corresponding one of the power amplifiers in the set of power amplifiers, wherein the set of primary windings are electromagnetically coupled to a secondary winding such that power received on each primary winding is additively transferred to the secondary winding;
a first set of elements coupled between the positive terminals of the set of primary windings and a first common terminal and a second set of elements coupled between the negative terminals of the first set of primary windings and a second common terminal wherein, the first network elements and the second network elements forming a current path outside the set of power amplifiers,
wherein, a first current induced on at least one primary winding, when a power amplifier coupled to the corresponding primary winding is in "off" state, flows through the current path.

19. The transmitter of claim 18, wherein the first set of elements and second set of elements comprise a first resistor network and a second resistor network, respectively.

20. The transmitter of claim 19, wherein the set of primary windings are formed on a metal layer and the secondary winding is formed on a redistribution layer of the integrated circuit.

* * * * *